(12) United States Patent
Bruce et al.

(10) Patent No.: US 8,118,561 B2
(45) Date of Patent: Feb. 21, 2012

(54) EROSION- AND IMPACT-RESISTANT COATINGS

(75) Inventors: Robert William Bruce, Loveland, OH (US); John William Hanify, West Chester, OH (US); Roger O. Barbe, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 845 days.

(21) Appl. No.: 12/201,566

(22) Filed: Aug. 29, 2008

(65) Prior Publication Data

US 2009/0011195 A1 Jan. 8, 2009

Related U.S. Application Data

(63) Continuation-in-part of application No. 11/656,974, filed on Jan. 24, 2007, now Pat. No. 7,581,933, which is a continuation of application No. 10/898,755, filed on Jul. 26, 2004, now Pat. No. 7,186,092.

(51) Int. Cl.
*F01D 5/14* (2006.01)
*F01D 5/28* (2006.01)

(52) U.S. Cl. ............ 416/241 R; 416/223 R; 416/229 R; 415/200; 415/217.1; 428/610; 427/180

(58) Field of Classification Search .............. 416/223 R, 416/224 R, 229 A, 229 R, 241 B; 415/200, 415/217.1; 428/610, 627, 216; 427/180
See application file for complete search history.

(56) References Cited

U.S. PATENT DOCUMENTS 3,793,012 A * 2/1974 Walter et al. ................... 148/404
4,096,296 A * 6/1978 Galmiche et al. ......... 416/241 B
4,790,721 A * 12/1988 Morris et al. ............... 416/96 A
4,832,252 A * 5/1989 Fraser ........................... 416/224
6,428,280 B1 * 8/2002 Austin et al. ............... 416/241 B (Continued)

FOREIGN PATENT DOCUMENTS

WO 2007083361 A1 7/2007

OTHER PUBLICATIONS

Wei R et al., "Deposition of thick nitrides and carbonitrides for sand erosion protection", Surface and Coatings Technology, Sep. 2006, pp. 4453-4459, vol. 201, No. 7, Elsevier, Amsterdam.
Wei R et al., "Erosion resistance of thick nitrate and carbonitride coatings deposited using plasma enhanced magnetron sputtering", Plasma Processes and Polymers, May 2007, pp. S693-S699, vol. 4, No. S1, Wiley-VCH Verlag.

(Continued)

*Primary Examiner* — Igor Kershteyn
(74) *Attorney, Agent, or Firm* — William Scott Andes; Gary M. Hartman; Domenica N. S. Hartman

(57) ABSTRACT

Erosion- and impact-resistant ceramic coatings suitable for protecting surfaces subjected to collisions with particles, including nominally round particles that typically inflict impact damage and more aggressive irregular-shaped particles that typically inflict erosion damage. The ceramic coating is formed to have one of three compositions: at least one layer of titanium aluminum nitride (TiAlN) having a thickness of about 25 to about 100 micrometers; multiple layers of chromium nitride (CrN) and TiAlN, each layer having a thickness of about 0.2 to about 1.0 micrometers to yield a total coating thickness of at least about 3 micrometers; and at least one layer of titanium silicon carbonitride (TiSiCN) having a thickness of about 15 to about 100 micrometers. The ceramic coating preferably has a total coating thickness of up to about 100 micrometers, and is deposited by a physical vapor deposition process to have a columnar and/or dense microstructure.

20 Claims, 3 Drawing Sheets

U.S. PATENT DOCUMENTS

| | | |
|---|---|---|
| 7,060,345 B2 | 6/2006 | Fukui et al. |
| 7,410,707 B2 | 8/2008 | Fukui et al. |
| 2004/0219395 A1 | 11/2004 | Imamura et al. |
| 2006/0018760 A1 | 1/2006 | Bruce et al. |
| 2007/0298280 A1 | 12/2007 | Omori et al. |
| 2009/0123737 A1 | 5/2009 | Yasui et al. |

OTHER PUBLICATIONS

International Search Report issued in connection with PCT Application No. PCT/US2009/051092 on Mar. 10, 2010.

* cited by examiner

EROSION- AND IMPACT-RESISTANT COATINGS

CROSS REFERENCE TO RELATED APPLICATIONS

This is a continuation-in-part patent application of U.S. patent application Ser. No. 11/656,974, filed Jan. 24, 2007, which is a continuation patent application of Ser. No. 10/898,755, filed Jul. 26, 2004, now U.S. Pat. No. 7,186,092. The contents of these prior applications are incorporated herein by reference.

BACKGROUND OF THE INVENTION

The present invention generally relates to protective coatings, and more particularly to erosion- and impact-resistant coatings suitable for use in gas turbine engines.

Gas turbines, including gas turbine engines, generally comprise a compressor, a combustor within which a mixture of fuel and air from the compressor is burned to generate combustion gases, and a turbine driven to rotate by the combustion gases leaving the combustor. Both the compressor and turbine utilize blades with airfoils against which air (compressor) or combustion gases (turbine) are directed during operation of the gas turbine engine, and whose surfaces are therefore subjected to impact and erosion damage from particles entrained in the air ingested by the engine. Turboshaft engines used in helicopters are particularly prone to ingesting significant amounts of particulates when operated under certain conditions, such as in desert environments where sand ingestion is likely.

Though both are attributable to ingested particles, impact damage can be distinguished from erosion damage. Impact damage is primarily caused by high kinetic energy particle impacts, and typically occurs on the leading edge of an airfoil. Traveling at relatively high velocities, particles strike the leading edge or section of the airfoil at a shallow angle to the pressure (concave) surface of the airfoil, such that impact with the leading edge is head-on or nearly so. Because the airfoil is typically formed of a metal alloy that is at least somewhat ductile, particle impacts can deform the leading edge, forming burrs that can disturb and constrain airflow, degrade compressor efficiency, and reduce the fuel efficiency of the engine. Erosion damage is primarily caused by glancing or oblique particle impacts on the pressure side of an airfoil, and tends to be concentrated in an area forward of the trailing edge, and secondarily in an area aft or beyond the leading edge. Such glancing impacts tend to remove material from the pressure surface, especially near the trailing edge. The result is that the airfoil gradually thins and loses its effective surface area due to chord length loss, resulting in a decrease in compressor performance of the engine. Compressor blades suffer from both impact and erosion damage, but are particularly susceptible to impact damage along their leading edges, as well as erosion damage on their pressure (concave) surfaces.

Compressors of gas turbine engines of the type used in helicopters are often fabricated as blisks, in which a disk and its blades are manufactured as a single integral part, as opposed to manufacturing the disk and blades separately and then assembling the blades on the disk. The blades of a blisk are typically protected with a coating that may be deposited using various techniques, including physical vapor deposition (PVD) and chemical vapor deposition (CVD) processes. The effectiveness of a protective coating on the blades of a blisk is particularly important since the entire blisk must be removed from the engine if sufficient erosion or impact damage has occurred. Coating materials widely used to protect blisk blades are generally hard, erosion-resistant materials such as nitrides and carbides. For example, see U.S. Pat. No. 4,904,528 to Gupta et al. (titanium nitride coatings), U.S. Pat. No. 4,839,245 to Sue et al. (zirconium nitride coatings), and U.S. Pat. No. 4,741,975 to Naik et al. (tungsten carbide and tungsten carbide/tungsten coatings). While exhibiting suitable erosion resistance, hard coating materials such as titanium nitride are not as resistant to impact damage. Greater impact resistance has been achieved with relatively thick coatings formed of tungsten carbide and chromium carbide applied by a high velocity oxy-fuel (HVOF) deposition process to thicknesses of about 0.003 inch (about 75 micrometers). As known in the art, HVOF deposition is a thermal spray process by which particles entrained in a supersonic stream of hydrogen and oxygen undergoing combustion are directed at a surface, and the softened particles deposit as "splats" to produce a coating having noncolumnar, irregular flattened grains and a degree of inhomogeneity and porosity.

The required thickness of these coating materials can result in excessively heavy coatings that may negatively affect the blade fatigue life (for example, high-cycle fatigue (HCF)), and for that reason the coatings are often applied to only the pressure side of a blade near the blade tip. Furthermore, while HVOF-deposited tungsten carbide and chromium carbide coatings perform well when subjected to relatively round particles found in desert sands, these coatings tend to exhibit higher rates of erosion when subjected to more aggressive particles, such as crushed alumina and crushed quartz, whose shapes tend to be more irregular with sharp corners.

PVD processes such as sputtering or electron beam physical vapor deposition (EB-PVD) deposit coatings that are microstructurally different from HVOF coatings in terms of being denser and/or having columnar microstructures. When deposited by these PVD processes, hard erosion-resistant materials such as nitrides and carbides perform better in terms of erosion resistance when subjected to aggressive media such as crushed alumina and crushed quartz. However, PVD-deposited coatings, which also differ from HVOF-deposited coatings in terms of mechanical properties such as ductility and elastic modulus, are susceptible to cracking and delamination when bombarded with round particles.

In view of the above, there is a need for coating materials that exhibit both erosion resistance and impact resistance for use as protective coatings on gas turbine blades, and particularly compressor blades of helicopters and other aircraft that operate in desert environments. It would also be desirable if such coatings were effective without contributing excessive weight to the compressor or adversely affecting desirable properties of the blades, such as fatigue life.

BRIEF DESCRIPTION OF THE INVENTION

The present invention provides erosion- and impact-resistant coatings suitable for protecting surfaces subjected to collisions with particles, including nominally round particles that tend to inflict impact damage and more aggressive irregular-shaped particles that tend to inflict erosion damage.

According to a first aspect of the invention, the erosion- and impact-resistant coating formed to have one of three compositions. A first of the compositions consists of titanium aluminum nitride (TiAlN) present as one or more layers with each layer having a thickness of about 25 to about 100 micrometers. A second of the compositions consists of multiple layers of chromium nitride (CrN) and TiAlN such that one or more layers of CrN are between one or more layers of TiAlN, each layer having a thickness of about 0.2 to about 1.0 micrometers to yield a total coating thickness of at least about 3 micrometers. The third composition consists of titanium silicon carbonitride (TiSiCN) present as one or more layers with each layer having a thickness of about 15 to about 100 micrometers. In each case, the coating has a total coating thickness of up to about 100 micrometers, and is deposited by a physical vapor deposition process to have a columnar and/or dense microstructure, as opposed to the noncolumnar, irregular, and porous microstructure that would result if coatings of the same compositions were deposited by HVOF.

A significant advantage of this invention is that, if deposited to achieve a total coating thickness of at least 15 micrometers and preferably at least 25 micrometers, the coating compositions exhibit resistance to both impact and erosion damage that is superior to tungsten carbide and chromium carbide coatings deposited by HVOF. Furthermore, the coating compositions are capable of providing useful levels of protection at lesser thicknesses than tungsten carbide and chromium carbide coatings deposited by HVOF. As a result, the coatings are well suited for use as protective coatings on gas turbine blades, and particularly compressor blades of helicopters and other aircraft that operate in desert environments, without contributing excessive weight or adversely affecting desirable properties of the blades.

Other objects and advantages of this invention will be better appreciated from the following detailed description.

DETAILED DESCRIPTION OF THE INVENTION

Figure 1:
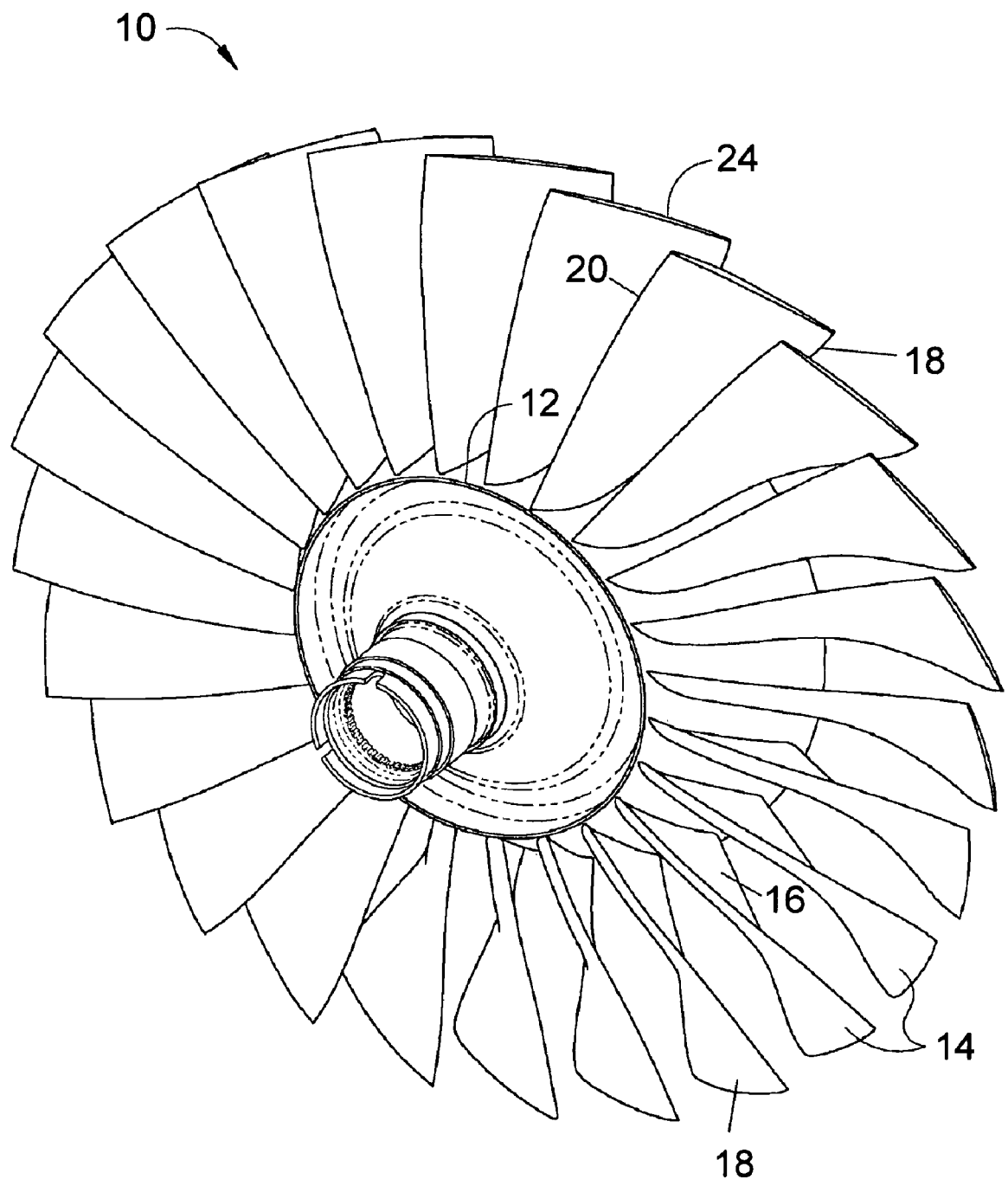
FIG. 1 is a perspective view of a compressor blisk with which coatings of this invention can be employed.

FIG. 1 represents a blisk 10 of a gas turbine engine. The blisk 10 has a hub 12 from which blades 14 radially extend. The blades 14 can be fabricated integral with the hub 12, yielding what is also referred to as a bladed disk or an integrally bladed rotor. The term "integral" is used to denote multiple components that effectively form a single member without any mechanical discontinuity therebetween, whether the components were originally separately formed and then metallurgically joined or originally formed from a single workpiece. The present invention is particularly well suited for blisks used as low-pressure fans on aircraft gas turbine engines, but is applicable to blisks used in other applications. Furthermore, the invention can be useful for other applications that require impact and erosion resistance, for example, blowers, impellers, splitters, fan components, Pitot tubes, venturi tubes, particle separators, aircraft landing gear components, power transmission components, instruments, etc.

Each blade 14 has an airfoil portion having oppositely-disposed concave (pressure) and convex (suction) surfaces 16 and 18, oppositely-disposed sides leading and trailing edges 20 and 22, and a blade tip 24. The blades 14 are constructed from a metal alloy that can be formed to the desired shape, withstand the necessary operating loads, and is compatible with the hub material. Examples of suitable alloys include, but are not limited to, titanium-, aluminum-, cobalt-, nickel-, and steel-based alloys. Particular examples include steels such as A286 (by weight, about 24% to 27% nickel, 13.5% to 16% chromium, 1% to 1.75% molybdenum, 1.9% to 2.3% titanium, 0.10% to 0.50% vanadium, 0.003% to 0.010% boron, 0.35% maximum aluminum, 0.08% maximum carbon, 2.00% maximum manganese, 1.00% maximum silicon, balance iron) and AM-355 (by weight, about 15% to 16% chromium, 4% to 5% nickel, 2.5% to 3.25% molybdenum, 0.07% to 0.13% nitrogen, 0.50% to 1.25% manganese, 0.50% maximum silicon, 0.040% maximum phosphorus, 0.030% maximum sulfur, balance iron), nickel-based alloys such as IN718 (by weight, about 50-55% nickel, 17-21% chromium, 2.8-3.3% molybdenum, 4.75-5.5% niobium+tantalum, 0-1% cobalt, 0.65-1.15% titanium, 0.2-0.8% aluminum, 0-0.35% manganese, 0-0.3% copper, 0.02-0.08% carbon, 0.006% maximum boron, the balance iron), and titanium-based alloys such as Ti-6Al-4V (by weight, about 6% aluminum, 4% vanadium, balance titanium) and Ti-8Al-1V-1Mo (by weight, about 8% aluminum, 1% vanadium, 1% molybdenum, balance titanium).

The leading edges 20 of the blades 14 tend to suffer from impact damage, whereas erosion damage tends to occur on the pressure surfaces 16 of the blades 14 particularly near the blade tips 24. To minimize impact damage, at least the leading edges 20 of the blades are protected with an erosion-resistant and impact-resistant ceramic coating, and to minimize erosion damage at least portions of the pressure surfaces 16 of the blades 14, and preferably the entire pressure surface 16 of each blade 14, is protected with the same erosion-resistant and impact-resistant ceramic coating. The coating may also be applied to the suction surface 18 of each blade 14, as well as the trailing edges 22 of the blades 14. The coating is preferably made up entirely of one or more ceramic compositions, and may be bonded to the blade substrate with a metallic bond coat.

According to the invention, the ceramic coating contains one or more layers of TiAlN, multiple layers of CrN and TiAlN in combination (for example, alternating layers), and one or more layers of TiSiCN, preferably without any metallic interlayers between the ceramic layers. The ceramic coating preferably has a thickness of up to about 100 micrometers, and more preferably about 25 to about 100 micrometers. Coating thicknesses exceeding 100 micrometers are believed to be unnecessary in terms of protection, and undesirable in terms of additional weight.

If the ceramic coating is made up of TiAlN, the entire coating thickness can consist of a single layer of TiAlN or multiple layers of TiAlN. Each layer may have a thickness of about 25 to about 100 micrometers. TiAlN is a hard material that promotes the erosion resistance of the ceramic coating. The use of multiple layers of TiAlN is believed to be beneficial for promoting stress relief within the coating.

If the ceramic coating is made up of multiple layers of CrN and TiAlN, each layer may have a thickness of about 0.2 to about 1.0 micrometers, more preferably about 0.3 to about 0.6 micrometers, to yield a total coating thickness of at least about 3 micrometers. CrN contributes corrosion resistance and elastic behavior to the ceramic coating, that latter of which promotes impact resistance, whereas TiAlN contributes hardness to promote the erosion resistance of the ceramic coating. The order of the CrN and TiAlN layers does not appear to be critical.

If the ceramic coating is made up of TiSiCN, the entire coating thickness can consist of a single layer of TiSiCN or multiple layers of TiSiCN. Each layer may have a thickness of about 15 to about 100 micrometers. The suitability of a single layer is believed to be the result of the silicon content (roughly about 3 weight percent) in the ceramic improving the erosion performance and elastic behavior of the ceramic coating.

The metallic bond coat may be made up of one or more metal layers, preferably one or more layers of titanium and/or titanium aluminum alloys, including titanium aluminide intermetallics. The bond coat can be limited to being located entirely between the ceramic coating and the substrate it protects for the purpose of promoting adhesion of the ceramic coating to the substrate.

The ceramic coating is preferably deposited by a physical vapor deposition (PVD) technique to have a columnar and/or dense microstructure, as opposed to the noncolumnar, irregular, and porous microstructure that would result if the ceramic coating were deposited by HVOF. Suitable PVD processes include EB-PVD, cathodic arc PVD, and sputtering, with sputtering believed to be preferred. Suitable sputtering techniques include but are not limited to direct current diode sputtering, radio frequency sputtering, ion beam sputtering, reactive sputtering, magnetron sputtering, plasma-enhanced magnetron sputtering, and steered arc sputtering. Magnetron sputtering and steered arc sputtering are particularly preferred for producing the ceramic coating of this invention due to their high coating rates. Sputtering is preferably carried out in an atmosphere containing a source of carbon (for example, methane), a source of nitrogen (for example, nitrogen gas), or a source of silicon and carbon (for example, trimethylsilane, $(CH_3)_3SiH$) to form the carbide, silicon, and/or nitride constituents of the deposited coating. The metallic bond coat and any other metallic layers are preferably deposited by performing the sputtering process in an inert atmosphere, for example, argon.

Figure 2:
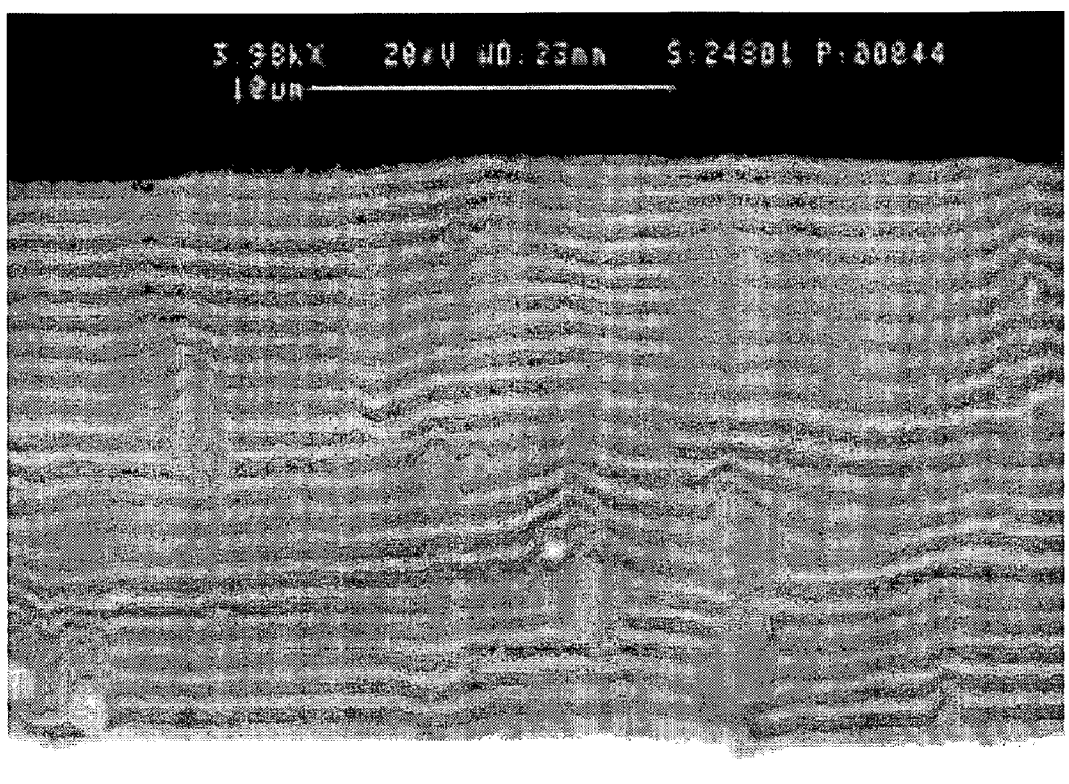
FIG. 2 is a scanned image of a multilayer coating in accordance with an embodiment of the present invention.

FIG. 2 is a scanned image of a multilayer coating of this invention formed by alternating layers of TiAlN and CrN. Each layer was deposited to a thickness of about one micrometer for a total coating thickness of about eighteen micrometers. As evident from FIG. 2, each layer is discreet but well bonded to each adjacent layer.

In an investigation leading up to the present invention, coatings having compositions and macrostructures described above were deposited on Ti-6Al-4V, Ti-8Al-1V-1Mo, and IN718 substrate specimens and tested along with other coating compositions deposited on similar substrates, as well as bare Ti-6Al-4V, Ti-8Al-1V-1Mo, and IN718 substrates. The coatings were deposited by steered arc sputtering in the presence of a reactive gas (reactive sputtering) to thicknesses of less than 25 micrometers up to about 50 micrometers. Specific coating compositions included the ceramic coatings of this invention (a single layer of TiAlN, approximately micrometer-thick alternating layers of TiAlN and CrN, and a single layer of TiSiCN), as well as titanium nitride (TiN) coatings deposited by PVD and tungsten carbide/cobalt (WC/Co) coatings deposited by HVOF.

Figure 3:
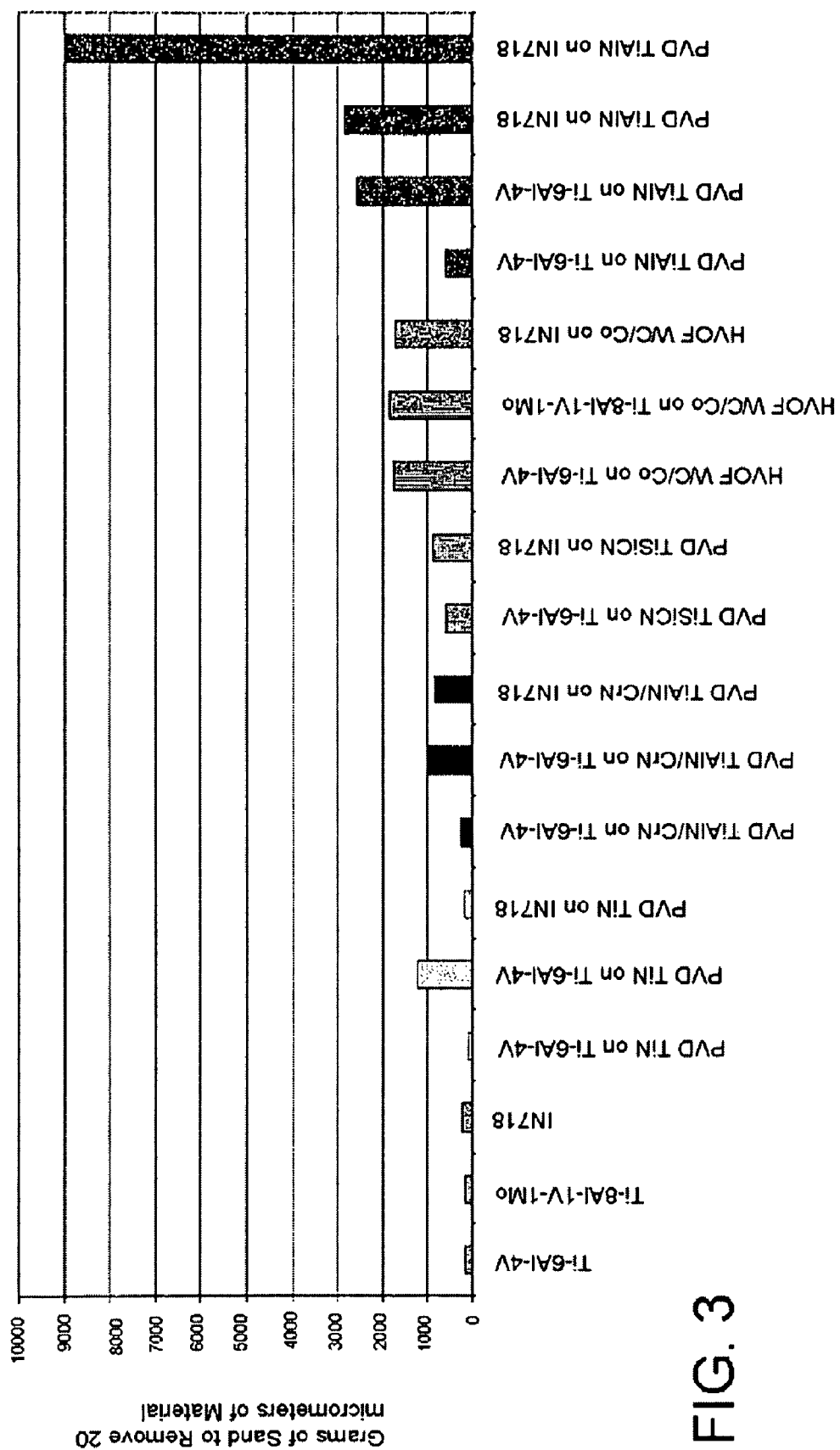
FIG. 3 is a bar graph representing data from comparative erosion tests performed on coating compositions of this invention and prior art coating compositions.

Coating erosion rates were evaluated using desert sand as the erosion media (erodent), and coating performance was assessed on the basis of erosion rate (coating thickness loss per gram of erodent). The erodent had a particle size of about 50 to about 1500 micrometers, and was propelled at the test specimens at an incidence angle of about 30 degrees and a velocity of about 100 to 400 m/s. Results of the tests are plotted in FIG. 3, which evidences that, as a group, the TiAlN coatings performed the best under the test conditions. The disparity in erosion rates between the two TiAlN coatings on IN718 substrates and between the two TiAlN coatings on Ti-6Al-4V substrates was attributed to coating thicknesses, with the better performing coatings approaching 50 micrometers in thickness and the lesser performing coatings having thicknesses of less than 25 micrometers. From these results, it was evident that coating thickness was a result-effective parameter with respect to erosion rate (resistance), and that coating thicknesses of at least 25 micrometers were concluded to be preferred under the test conditions. As a group, the HVOF WC/Co coatings were second best in performance. However, subsequent testing of TiAlN/CrN and TiSiCN specimens deposited to thicknesses of greater than 50 micrometers exhibited lower erosion rates (better erosion resistance) than the HVOF WC/Co coatings, reinforcing the conclusion that erosion rate is dependent on coating thickness, and that TiAlN/CrN and TiSiCN are capable of exhibiting better erosion resistance than HVOF WC/Co coatings if deposited to a sufficient thickness.

From the investigation, it was concluded that sputtered coatings made up of either a single layer of TiAlN, alternating layers of TiAlN and CrN, or a single layer of TiSiCN are capable of exhibiting impact erosion resistance to round impact media that is superior to prior art HVOF carbide coatings. Improved impact erosion resistance was attributed to improved adhesion between the coatings and substrates and between individual layers of the coatings, as evidenced by reducing cracking and delamination of the coatings.

While the invention has been described in terms of specific embodiments, it is apparent that other forms could be adopted by one skilled in the art. Therefore, the scope of the invention is to be limited only by the following claims.

The invention claimed is:

1. An erosion- and impact-resistant ceramic coating on a surface subjected to collisions with particles, the ceramic coating being deposited by a physical vapor deposition process to have a columnar and/or dense microstructure, a total coating thickness of up to about 100 micrometers, and a composition chosen from the group consisting of:
   at least one layer of TiAlN having a thickness of about 25 to about 100 micrometers;
   multiple layers of CrN and TiAlN such that layers of CrN are between layers of TiAlN, each layer having a thickness of about 0.2 to about 1.0 micrometers to yield a total coating thickness of at least about 3 micrometers; and
   at least one layer of TiSiCN having a thickness of about 15 to about 100 micrometers.

2. The erosion- and impact-resistant coating according to claim 1, wherein the ceramic coating is bonded to the surface with a bond coat chosen from the group consisting of titanium and titanium aluminum alloys.

3. The erosion- and impact-resistant coating according to claim 1, wherein the ceramic coating consists of TiAlN.

4. The erosion- and impact-resistant coating according to claim 3, wherein the ceramic coating consists of a single layer of TiAlN.

5. The erosion- and impact-resistant coating according to claim 3, wherein the total coating thickness is about 25 to about 100 micrometers.

6. The erosion- and impact-resistant coating according to claim 1, wherein the ceramic coating consists of the multiple layers of CrN and TiAlN.

7. The erosion- and impact-resistant coating according to claim 5, wherein the total coating thickness is about 25 to about 100 micrometers.

8. The erosion- and impact-resistant coating according to claim 1, wherein the ceramic coating consists of TiSiCN.

9. The erosion- and impact-resistant coating according to claim 8, wherein the ceramic coating consists of a single layer of TiSiCN.

10. The erosion- and impact-resistant coating according to claim 8, wherein the total coating thickness is about 25 to about 100 micrometers.

11. The erosion- and impact-resistant coating according to claim 1, wherein the surface is on a gas turbine engine component.

12. The erosion- and impact-resistant coating according to claim 11, wherein the component is an airfoil of a blisk.

13. The erosion- and impact-resistant coating according to claim 12, wherein the airfoil has oppositely-disposed concave and convex surface and an oppositely-disposed leading and trailing edges, and the ceramic coating is present on at least the concave surface.

14. The erosion- and impact-resistant coating according to claim 13, wherein the ceramic coating entirely covers the concave surface of the airfoil.

15. The erosion- and impact-resistant coating according to claim 11, wherein the surface is formed by a substrate material chosen from the group consisting of steel alloys, nickel-based alloys, and titanium-based alloys.

16. A method of depositing the erosion- and impact-resistant coating according of claim 1, the method comprising depositing the ceramic coating by sputtering.

17. An erosion- and impact-resistant ceramic coating on a concave airfoil surface of a gas turbine, the ceramic coating being deposited by sputtering to have a columnar and/or dense microstructure, a total coating thickness of up to about 100 micrometers, and a composition chosen from the group consisting of:
 a single layer of TiAlN having a thickness of about 25 to about 100 micrometers;
 multiple layers of CrN and TiAlN such that layers of CrN are between layers of TiAlN, each layer having a thickness of about 0.2 to about 1.0 micrometers to yield a total coating thickness of at least about 3 micrometers; and
 a single layer of TiSiCN having a thickness of about 15 to about 100 micrometers.

18. The erosion- and impact-resistant coating according to claim 17, wherein the ceramic coating consists of the single layer of TiAlN.

19. The erosion- and impact-resistant coating according to claim 17, wherein the ceramic coating consists of the multiple layers of CrN and TiAlN.

20. The erosion- and impact-resistant coating according to claim 17, wherein the ceramic coating consists of the single layer of TiSiCN.

* * * * *

(12) EX PARTE REEXAMINATION CERTIFICATE (10175th)
United States Patent
Bruce et al.

(10) Number: US 8,118,561 C1
(45) Certificate Issued: May 21, 2014

(54) EROSION- AND IMPACT-RESISTANT COATINGS

(75) Inventors: Robert William Bruce, Loveland, OH (US); John William Hanify, West Chester, OH (US); Roger O. Barbe, Cincinnati, OH (US)

(73) Assignee: General Electric Company, Schenectady, NY (US)

Reexamination Request:
No. 90/012,796, Feb. 15, 2013

Reexamination Certificate for:
Patent No.: 8,118,561
Issued: Feb. 21, 2012
Appl. No.: 12/201,566
Filed: Aug. 29, 2008

Related U.S. Application Data

(63) Continuation-in-part of application No. 11/656,974, filed on Jan. 24, 2007, now Pat. No. 7,581,933, which is a continuation of application No. 10/898,755, filed on Jul. 26, 2004, now Pat. No. 7,186,092.

(51) Int. Cl.
*F01D 5/14* (2006.01)
*F01D 5/28* (2006.01)
*C23C 14/06* (2006.01)

(52) U.S. Cl.
CPC ............ *C23C 14/0641* (2013.01); *F01D 5/288* (2013.01)

USPC ................... 416/241 R; 415/200; 415/217.1; 416/223 R; 416/229 R; 427/180; 428/610

(58) Field of Classification Search
None
See application file for complete search history.

(56) References Cited

To view the complete listing of prior art documents cited during the proceeding for Reexamination Control Number 90/012,796, please refer to the USPTO's public Patent Application Information Retrieval (PAIR) system under the Display References tab.

*Primary Examiner* — Sean E Vincent

(57) ABSTRACT

Erosion- and impact-resistant ceramic coatings suitable for protecting surfaces subjected to collisions with particles, including nominally round particles that typically inflict impact damage and more aggressive irregular-shaped particles that typically inflict erosion damage. The ceramic coating is formed to have one of three compositions: at least one layer of titanium aluminum nitride (TiAlN) having a thickness of about 25 to about 100 micrometers; multiple layers of chromium nitride (CrN) and TiAlN, each layer having a thickness of about 0.2 to about 1.0 micrometers to yield a total coating thickness of at least about 3 micrometers; and at least one layer of titanium silicon carbonitride (TiSiCN) having a thickness of about 15 to about 100 micrometers. The ceramic coating preferably has a total coating thickness of up to about 100 micrometers, and is deposited by a physical vapor deposition process to have a columnar and/or dense microstructure.

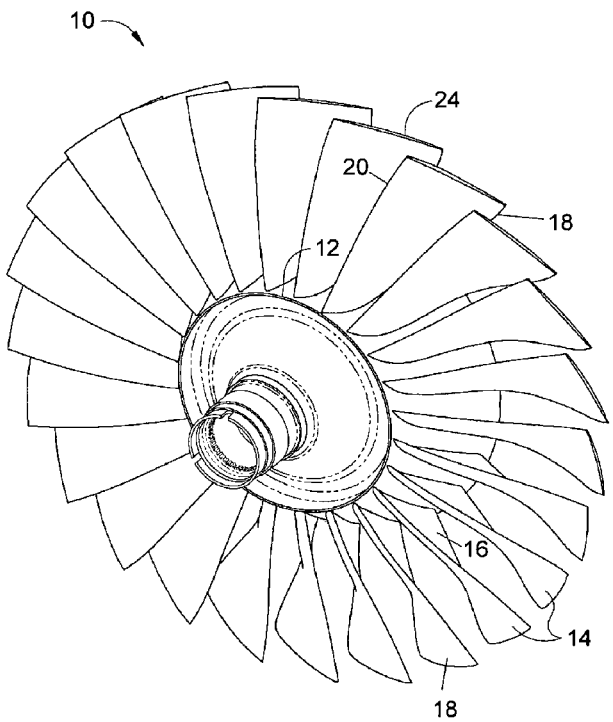

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 5, 8-10, 19 and 20 are cancelled.

Claims 1, 3, 4, 6, 7, 17 and 18 are determined to be patentable as amended.

Claims 2 and 11-16, dependent on an amended claim, are determined to be patentable.

New claim 21 is added and determined to be patentable.

1. An erosion- and impact-resistant ceramic coating on a surface subjected to collisions with particles, the ceramic coating being deposited by a physical vapor deposition process to have a columnar and/or dense microstructure, a total coating thickness of up to about 100 micrometers, and a composition [chosen from the group] consisting [of:] *of* at least one layer of TiAlN having a thickness of about 25 to about 100 [micrometers;
    multiple layers of CrN and TiAlN such that layers of CrN are between layers of TiAlN, each layer having a thickness of about 0.2 to about 1.0 micrometers to yield a total coating thickness of at least about 3 micrometers; and
    at least one layer of TiSiCN having a thickness of about 15 to about 100] *micrometers*.

3. The erosion- and impact-resistant coating according to claim 1, wherein the [ceramic coating consists of TiAlN] *total coating thickness is about 25 to about 51 micrometers*.

4. The erosion- and impact-resistant coating according to claim [3] *1*, wherein the ceramic coating consists of a single layer of TiAlN.

6. [The] *An* erosion- and impact-resistant coating [according to claim 1, wherein the ceramic coating consists of the] *on a surface subjected to collisions with particles, the ceramic coating being deposited by a physical vapor deposition process to have a columnar and/or dense microstructure, a total coating thickness of up to about 100 micrometers, and a composition consisting of* multiple layers of CrN and TiAlN such that layers of CrN are between layers of TiAlN, each layer having a thickness of about 0.2 to about 1.0 micrometers to yield a total coating thickness of at least about 3 micrometers.

7. The erosion- and impact-resistant coating according to claim [5] *6*, wherein the total coating thickness is about 25 to about 100 micrometers.

17. An erosion- and impact-resistant ceramic coating on a concave airfoil surface of a gas turbine, the ceramic coating being deposited by sputtering to have a columnar and/or dense microstructure, a total coating thickness of up to about 100 micrometers, and a composition [chosen from the group] consisting [of:] *of* a single layer of TiAlN having a thickness of about 25 to about 100 [micrometers;
    multiple layers of CrN and TiAlN such that layers of CrN are between layers of TiAlN, each layer having a thickness of about 0.2 to about 1.0 micrometers to yield a total coating thickness of at least about 3 micrometers; and
    a single layer of TiSiCN having a thickness of about 15 to about 100] *micrometers*.

18. The erosion- and impact-resistant coating according to claim 17, wherein the [ceramic coating consists of the single layer of TiAlN] *total coating thickness is about 25 to about 51 micrometers*.

*21. The erosion- and impact-resistant coating according to claim 6, wherein the ceramic coating is bonded to the surface with a bond coat chosen from the group consisting of titanium and titanium aluminum alloys.*

\* \* \* \* \*

(12) EX PARTE REEXAMINATION CERTIFICATE (10692nd)
United States Patent
Bruce et al.

(10) Number: US 8,118,561 C2
(45) Certificate Issued: Aug. 26, 2015

(54) EROSION- AND IMPACT-RESISTANT COATINGS

(75) Inventors: Robert William Bruce, Loveland, OH (US); John William Hanify, West Chester, OH (US); Roger O. Barbe, Cincinnati, OH (US)

(73) Assignee: GENERAL ELECTRIC COMPANY, Schenectady, NY (US)

Reexamination Request:
No. 90/013,314, Aug. 5, 2014

Reexamination Certificate for:
Patent No.: 8,118,561
Issued: Feb. 21, 2012
Appl. No.: 12/201,566
Filed: Aug. 29, 2008

Reexamination Certificate C1 8,118,561 issued May 21, 2014

Related U.S. Application Data

(63) Continuation-in-part of application No. 11/656,974, filed on Jan. 24, 2007, now Pat. No. 7,581,933, which is a continuation of application No. 10/898,755, filed on Jul. 26, 2004, now Pat. No. 7,186,092.

(51) Int. Cl.
| | |
|---|---|
| *F01D 5/14* | (2006.01) |
| *F01D 5/28* | (2006.01) |
| *C23C 14/06* | (2006.01) |
| *C23C 28/04* | (2006.01) |
| *C23C 28/00* | (2006.01) |
| *C23C 30/00* | (2006.01) |
| *F01D 25/00* | (2006.01) |

(52) U.S. Cl.
CPC ......... *C23C 14/0641* (2013.01); *C23C 14/0664* (2013.01); *C23C 28/04* (2013.01); *C23C 28/321* (2013.01); *C23C 28/322* (2013.01); *C23C 28/34* (2013.01); *C23C 28/42* (2013.01); *C23C 30/00* (2013.01); *F01D 5/288* (2013.01); *F01D 25/007* (2013.01)

(58) Field of Classification Search
None
See application file for complete search history.

(56) References Cited

To view the complete listing of prior art documents cited during the proceeding for Reexamination Control Number 90/013,314, please refer to the USPTO's public Patent Application Information Retrieval (PAIR) system under the Display References tab.

*Primary Examiner* — Sean E Vincent

(57) ABSTRACT

Erosion- and impact-resistant ceramic coatings suitable for protecting surfaces subjected to collisions with particles, including nominally round particles that typically inflict impact damage and more aggressive irregular-shaped particles that typically inflict erosion damage. The ceramic coating is formed to have one of three compositions: at least one layer of titanium aluminum nitride (TiAlN) having a thickness of about 25 to about 100 micrometers; multiple layers of chromium nitride (CrN) and TiAlN, each layer having a thickness of about 0.2 to about 1.0 micrometers to yield a total coating thickness of at least about 3 micrometers; and at least one layer of titanium silicon carbonitride (TiSiCN) having a thickness of about 15 to about 100 micrometers. The ceramic coating preferably has a total coating thickness of up to about 100 micrometers, and is deposited by a physical vapor deposition process to have a columnar and/or dense microstructure.

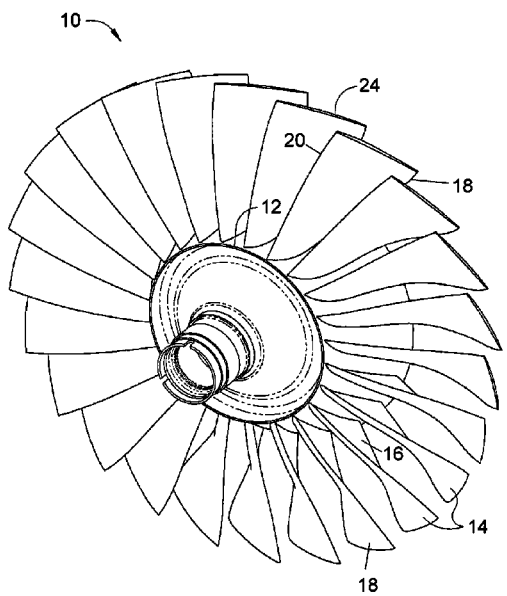

EX PARTE REEXAMINATION CERTIFICATE

THE PATENT IS HEREBY AMENDED AS INDICATED BELOW.

AS A RESULT OF REEXAMINATION, IT HAS BEEN DETERMINED THAT:

The patentability of claims 2 and 21 is confirmed.

Claims 5, 8-10, 19 and 20 were previously cancelled.

Claims 1, 3, 4, 6, 7 and 11-18 are cancelled.

\* \* \* \* \*